US011094883B2

(12) United States Patent
Park et al.

(10) Patent No.: US 11,094,883 B2
(45) Date of Patent: Aug. 17, 2021

(54) STRUCTURE AND METHOD TO FABRICATE RESISTIVE MEMORY WITH VERTICAL PRE-DETERMINED FILAMENT

(71) Applicant: International Business Machines Corporation, Armonk, NY (US)

(72) Inventors: Chanro Park, Clifton Park, NY (US); Kangguo Cheng, Schenectady, NY (US); Ruilong Xie, Niskayuna, NY (US); Choonghyun Lee, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 32 days.

(21) Appl. No.: 16/670,215

(22) Filed: Oct. 31, 2019

(65) Prior Publication Data
US 2021/0135108 A1    May 6, 2021

(51) Int. Cl.
*H01L 45/00*  (2006.01)
*H01L 27/24*  (2006.01)

(52) U.S. Cl.
CPC ........ *H01L 45/1691* (2013.01); *H01L 45/085* (2013.01); *H01L 45/1233* (2013.01);
(Continued)

(58) Field of Classification Search
CPC ............ H01L 45/1691; H01L 45/1658; H01L 45/1266; H01L 45/1683; H01L 45/1233;
(Continued)

(56) References Cited

U.S. PATENT DOCUMENTS 7,960,216 B2   6/2011  Phatak
8,048,755 B2  11/2011  Sandhu et al.
(Continued)

FOREIGN PATENT DOCUMENTS

CN  104253140 A   12/2014
JP  2010062265 A   3/2010
WO  2018063320    4/2018

OTHER PUBLICATIONS

Y. Hayakawa et al., "Highly reliable TaOx ReRAM with centralized filament for 28-nm embedded application" Symposium on VLSI Technology Digest of Technical Papers 2015.
(Continued)

*Primary Examiner* — Matthew L Reames
(74) *Attorney, Agent, or Firm* — Fleit Intellectual Property Law; Jose Gutman

(57) ABSTRACT

A semiconductor structure including a vertical resistive memory cell and a fabrication method therefor. The method includes forming a sacrificial layer over a transistor drain contact; forming a first dielectric layer over the sacrificial layer; forming a cell contact hole through the first dielectric layer; forming an access contact hole through the first dielectric layer and exposing the sacrificial layer; removing the sacrificial layer thereby forming a cavity connecting a bottom opening of the cell contact hole and a bottom opening of the access contact hole; forming by atomic layer deposition in the cell contact hole a second dielectric layer including a seam; forming a bottom electrode within the cavity and in contact with the drain contact, the second dielectric layer, and the seam; and forming a top electrode over the first dielectric layer and in contact with the second dielectric layer and the seam.

13 Claims, 11 Drawing Sheets

(52) U.S. Cl.
CPC ........ *H01L 45/1266* (2013.01); *H01L 45/145* (2013.01); *H01L 45/1616* (2013.01); *H01L 45/1658* (2013.01); *H01L 45/1675* (2013.01); *H01L 45/1683* (2013.01); *H01L 27/2436* (2013.01)

(58) Field of Classification Search
CPC ............. H01L 45/1675; H01L 45/1616; H01L 45/085; H01L 45/145; H01L 27/2436
See application file for complete search history.

(56) References Cited

U.S. PATENT DOCUMENTS

| | | |
|---|---|---|
| 8,129,250 B2 | 3/2012 | Rossel et al. |
| 8,269,204 B2 | 9/2012 | Greene et al. |
| 9,444,040 B2 | 9/2016 | Sato et al. |
| 9,805,793 B2 | 10/2017 | Rajamohanan et al. |
| 9,847,480 B2 | 12/2017 | Tu |
| 9,917,251 B2 | 3/2018 | Fest et al. |
| 2004/0099930 A1 | 5/2004 | Konishi et al. |
| 2011/0193044 A1 | 8/2011 | Sandhu et al. |
| 2014/0166961 A1 | 6/2014 | Liao et al. |

OTHER PUBLICATIONS

Gang Niu et al., "Geometric conductive filament confinement by nanotips forresistive switching of HfO2-RRAM devices with high performance" Scientific Reports May 16, 2016.

PCT International Search Report for International Application No. PCT/IB2020/059568 dated Feb. 11, 2021.

STRUCTURE AND METHOD TO FABRICATE RESISTIVE MEMORY WITH VERTICAL PRE-DETERMINED FILAMENT

BACKGROUND

The present invention generally relates to the field of semiconductors, and more particularly relates to a method of fabricating resistive memory devices.

Resistive random access memory (ReRAM) is a type of non-volatile memory whose operation principal is based on resistance difference between on and off states. A conductive-bridging random access memory (CBRAM) is another type of non-volatile memory whose operation principal is based on resistance difference between on and off states. Depending on the physical connection of multiple nano-sized filament(s) between top and bottom electrodes of each memory cell in this type of non-volatile memory, a high resistance or a low resistance is defined.

A problem with this type of non-volatile memory, e.g., ReRAM or CBRAM, is that it is impossible to predict where and how many filaments are formed in each memory cell in such a non-volatile memory. Therefore, in such a non-volatile memory the memory cell to memory cell operation can be non-uniform and unpredictable, resulting in rather poor overall performance. Because of the uncertainty of filament formation in each memory cell as compared to another memory cell in such a non-volatile memory, the reliability of operation of the non-volatile memory is severely impacted.

SUMMARY OF THE INVENTION

Various embodiments of the present invention include fabrication of a semiconductor structure including at least one resistive memory cell (also referred to as resistive memory element). A method and structure, for example, include forming at least one resistive memory cell in a semiconductor structure. The method comprises: forming a sacrificial layer on, and in contact with, an electrical contact of a transistor; forming a first dielectric layer over, and in contact with, the sacrificial layer; forming a cell contact hole through the first dielectric layer and exposing a first portion of the sacrificial layer; forming an access contact hole through the first dielectric layer and exposing a second portion of the sacrificial layer; removing remaining portion of the sacrificial layer thereby forming a cavity directly connecting a bottom opening of the cell contact hole and a bottom opening of the access contact hole; forming a second dielectric layer on inner sidewalls of the first contact hole above the cavity, wherein a seam is formed in the second dielectric layer between the inner sidewalls of the cell contact hole; forming a bottom electrode within a portion of the cavity, the bottom electrode in contact with a top surface of the electrical contact and with a bottom surface of the second dielectric layer and a bottom surface of the seam; and forming a top electrode over the dielectric layer and in direct contact with a top surface of the second dielectric layer and a top surface of the seam.

According to various embodiments, a semiconductor structure comprises at least one memory cell comprising one transistor and one resistor. The semiconductor structure comprises: a transistor including a drain, a gate, and a source; and a vertical memory resistive element having first and second electrical contacts. The first or the second of the electrical contacts is electrically connected to the drain of the transistor.

The vertical memory resistive element, according to an example embodiment, includes a vertically-oriented seam located proximate to a center region of a length of the vertical memory resistive element from the first electrical contact to the second electrical contact. The vertically-oriented seam extends from the first electrical contact to the second electrical contact. The vertically-oriented seam, according to the example embodiment, comprises one conductive filament extending from the first electrical contact to the second electrical contact.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
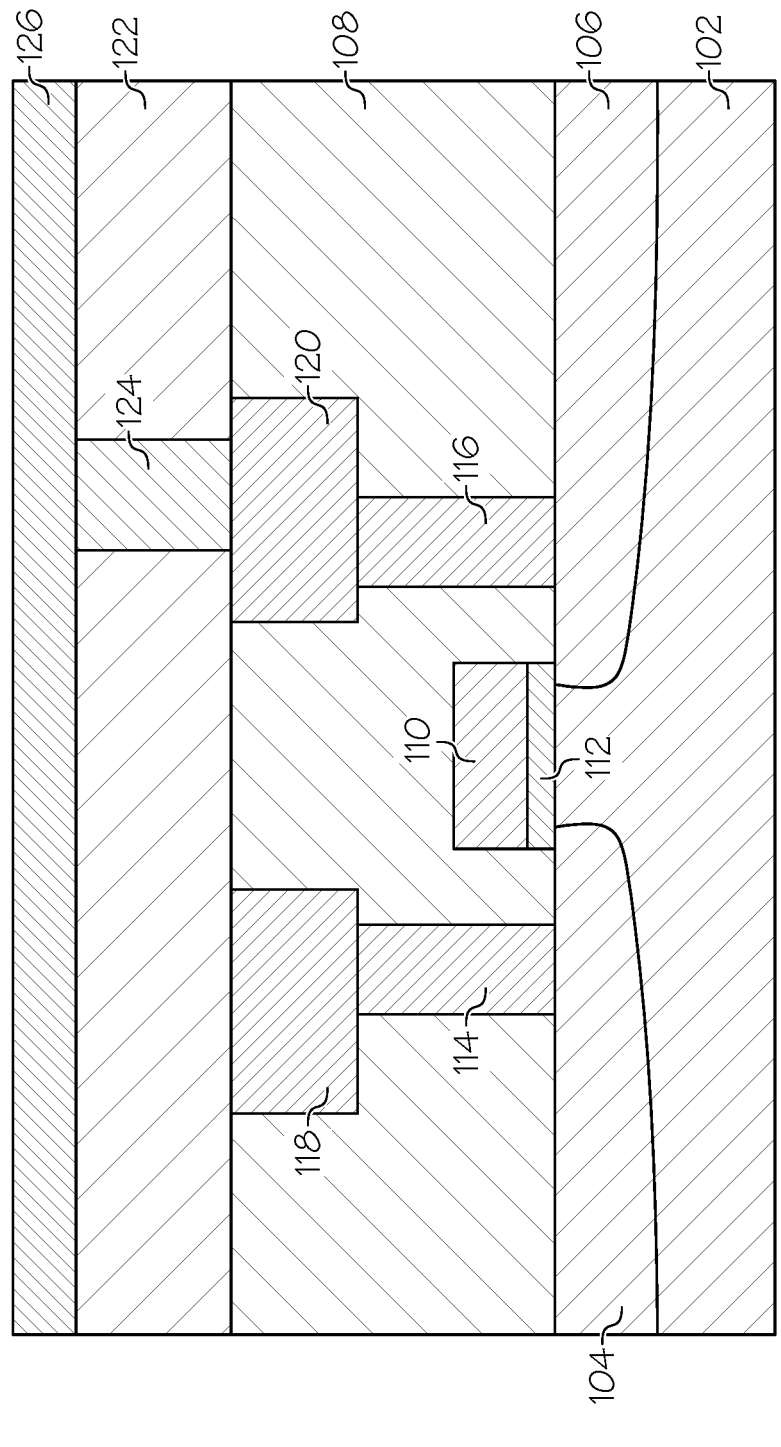
FIG. 1 is a cross-sectional side view of an example semiconductor structure at a first point in an example fabrication process such as for fabricating resistive memory devices, according to an embodiment of the present invention.

It is to be understood that the present invention will be described in terms of illustrative example fabrication processes for fabricating semiconductor structures including field-effect transistor semiconductor devices and/or other types of transistors. However, other semiconductor architectures, structures, substrate materials, and process features and steps may be varied within the scope of the present invention.

The inventors have discovered that it is highly desirable to have a resistive random access memory (ReRAM), including a conductive-bridging random access memory (CBRAM), forming a single filament in a pre-determined position in a resistive memory cell.

Various embodiments of the present invention include a new and novel architecture for a semiconductor structure that comprises at least one non-volatile memory device. The memory device includes, for example, a plurality of resistive memory cells (also referred to herein as resistive memory elements) on the same semiconductor substrate on a wafer. This structure may be used, for example, to create CMOS non-volatile memory devices in an integrated circuit.

It will be understood that when an element such as a layer, region or substrate is referred to as being "on" or "over" or "above" another element, it can be directly "on" or "over" or "above" the other element or intervening elements may also be present. Similar but inverse meaning will be understood for an element such as a layer, region, or substrate that is referred to as being "under" or "below" another element. It can be directly "under" or "below" the other element or intervening elements may also be present. In contrast, when an element is referred to as being "directly on" or "directly over" or "directly above" another element, or alternatively referred to as being "directly under" or "directly below" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used as part of a process in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be understood that the various layers and/or regions shown in the accompanying drawings are not drawn to scale, and that one or more layers and/or regions of a type commonly used in complementary metal-oxide semiconductor (CMOS), field-effect transistor (FET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with various embodiments of the present invention can be employed in applications, hardware, and/or electronic systems. Suitable electronic hardware and systems for implementing embodiments of the invention may include, but are not limited to, personal computers, communication networks, electronic commerce systems, portable communications devices (e.g., cellular and smart phones), solid-state media storage devices, functional circuitry, etc. Systems and hardware incorporating the semiconductor devices and structures are contemplated embodiments of the invention. Given the teachings of example embodiments of the invention provided herein, one of ordinary skill in the art will be able to contemplate other implementations and applications of embodiments of the invention.

Various embodiments of the present invention can be implemented in connection with semiconductor devices, and related semiconductor fabrication processes, that may use CMOSs, MOSFETs and/or FETs technology. By way of non-limiting example, the semiconductor devices can include, but are not limited to CMOS, MOSFET, and FET devices, and/or semiconductor devices that use CMOS, MOSFET and/or FET technology.

As used herein, "vertical" refers to a direction perpendicular to a substrate in any cross-sectional and three-dimensional views herein. Current can be described herein as flowing in a vertical direction (e.g., between a bottom electrode in a vertically-oriented resistive memory cell and a top electrode in the vertically-oriented resistive memory cell that is above the bottom electrode). As used herein, "horizontal" refers to a direction parallel to a substrate in any cross-sectional and three-dimensional views herein.

As used herein, "thickness", "thick", or the like, refers to a size of an element (e.g., a layer, trench, hole, etc.) in a cross-sectional view measured from a bottom surface to a top surface, or from a left side surface to a right side surface of the element, and/or measured with respect to a surface directly adjacent to and contacting the element (e.g., a surface on which the element is directly disposed on).

Additionally, the terms "width" or "width value", and the like, refer to a distance from a start point on a structure to an end point on the same structure, in a critical dimension. For example, a width value could be horizontally measured along a critical dimension from a start point of a vertical contact metal structure to an end point on the same vertical contact metal structure.

Unless otherwise specified, as used herein, "height" or "height above a substrate" refers to a vertical size of an element (e.g., a layer, trench, hole, etc.) in a cross-sectional view measured from a top surface of the substrate to a top surface of the element. A thickness of an element can be equal to a height of the element if the element is directly on the substrate.

As used herein, the terms "lateral," "lateral side," "lateral surface" refer to a side surface of an element (e.g., a layer, opening, a sidewall spacer, etc.), such as a left or right side surface in a cross-sectional view herein.

Referring now to the drawings in which like numerals represent the same or similar elements, FIGS. 1-4, are cross-sectional side views of the illustrated semiconductor structure 100 at select points in an example fabrication process. The line 5-5 shown in FIG. 4 passes over a portion of the illustrated semiconductor structure 100 and corresponds to a top planar view of the illustrated semiconductor structure 100 shown in FIG. 5. FIGS. 6-10, are cross-sectional side views of the illustrated semiconductor structure 100 at subsequent select points in the example fabrication process.

The example semiconductor structure 100 shown in FIG. 1 will be used in the present discussion to illustrate an example semiconductor fabrication process, according to various embodiments of the invention.

As shown in FIG. 1, according to one example semiconductor fabrication process, a transistor integration fabrication process forms a transistor supported on a circuit supporting substrate 102. The transistor includes a gate stack interposed, and adjacent to, a respective plurality of source/drain stacks, as shown in FIG. 1. The gate stack and the plurality of source/drain stacks are formed in a dielectric layer 108 supported by the circuit supporting substrate 102. It should be noted that a transistor is a non-limiting example of one type of memory cell selector device used in non-volatile random access memories to select at least one memory cell. However, other types of memory cell selector devices can be used according to various embodiments of the invention. A diode, for example, can also be used as a memory cell selector device.

The substrate 102, according to various embodiments, comprises at least one material selected from the following set of materials consisting of: silicon (Si), silicon germanium (SiGe), silicon carbide (SiC), Si:C (carbon doped silicon), silicon germanium carbide (SiGeC), carbon doped silicon germanium (SiGe:C), III-V compound semiconductor, or II-V compound semiconductor, an organic semiconductor, a layered semiconductor, a silicon-on-insulator, a SiGe-on-insulator, amorphous material, polycrystalline material, monocrystalline material, or a hybrid oriented (HOT) semiconductor material, or a combination of the materials in this set.

Each source/drain stack includes a respective epitaxial active region 104, 106, in the substrate 102. Each source/drain stack includes a source/drain metal 114, 116, and a top metal contact 118, 120, disposed respectively above the source/drain metal 114, 116.

The gate stack may be located over a respective fin channel in the substrate 102. For example, the fin channel in FIG. 1 is located in the substrate 102, below the gate stack, and adjacent to and contacting the two epitaxial active regions 104, 106, which forms a path for electrical current to pass horizontally between the two epitaxial active regions 104, of a transistor. The gate stack in the example shown in FIG. 1 includes a high-K dielectric layer 112 and a gate metal contact 110 disposed on, and contacting a top surface of, the high-K dielectric layer 112. The example shown in FIG. 1 is representative of a NFET or a PFET transistor. It should be noted that the discussions herein provide non-limiting examples for illustration of various aspects of embodiments of the invention. The example transistor discussed herein does not necessarily represent a real circuit layout. The example transistor discussion is provided merely to illustrate that an example process flow, according to an embodiment of the invention, could work on either or both NFET and PFET circuit elements.

A target metal contact (also referred to as a target electrical contact) 124, formed in an interlayer-layer dielectric (ILD) layer 122 is electrically connected to, according to the example, a first drain/source metal contact 114 or a second drain/source metal contact 116, or, according to various embodiments, electrically connected to a combination of the first set of drain/source metal contacts 114 and 118, or a combination of the second set of drain/source metal contacts 116, 120. According to the present example, the target metal contact 124 is electrically connected to a drain contact 116 (e.g., the second set of drain/source metal contacts 116, 120) of the transistor drain active region 106 shown in FIG. 1. The target metal contact 124, in the present discussion of an example fabrication process, may also be referred to as a drain contact 124. However, it should be clear that any combination of metal contacts of the transistor may be electrically coupled with the target metal contact 124, according to various embodiments.

Additionally, as discussed above, a transistor is one example type of memory selector device that can be used according to various embodiments. Other types of selector device can be alternatively, or in addition, used to select at least one memory cell in a non-volatile memory device. Generally, a selector device contact will be electrically connected to the target metal contact 124. The selector device can be electrically controlled to select a specific memory cell in a non-volatile memory device.

FIG. 1 illustrates a point in the example semiconductor fabrication process where a semiconductor material stack 102, 108, 122, including the substrate 102, the gate stack, and the plurality of drain/source stacks, has been provided. Thereafter, as shown in FIG. 1, an amorphous silicon (a-Si) sacrificial layer 126 has been deposited on the ILD layer 122 which is on the dielectric layer 108, followed by a planarization process, such as by a chemical and/or mechanical planarization (CMP) step or an etching step, which removes excess material from a top surface of the a-Si sacrificial layer in the semiconductor structure 100, and optionally removes excess material from a top surface of a wafer. The a-Si layer 126 may also be referred to as a sacrificial layer 126 because this a-Si layer 126 will be removed in downstream fabrication process steps.

Figure 2:
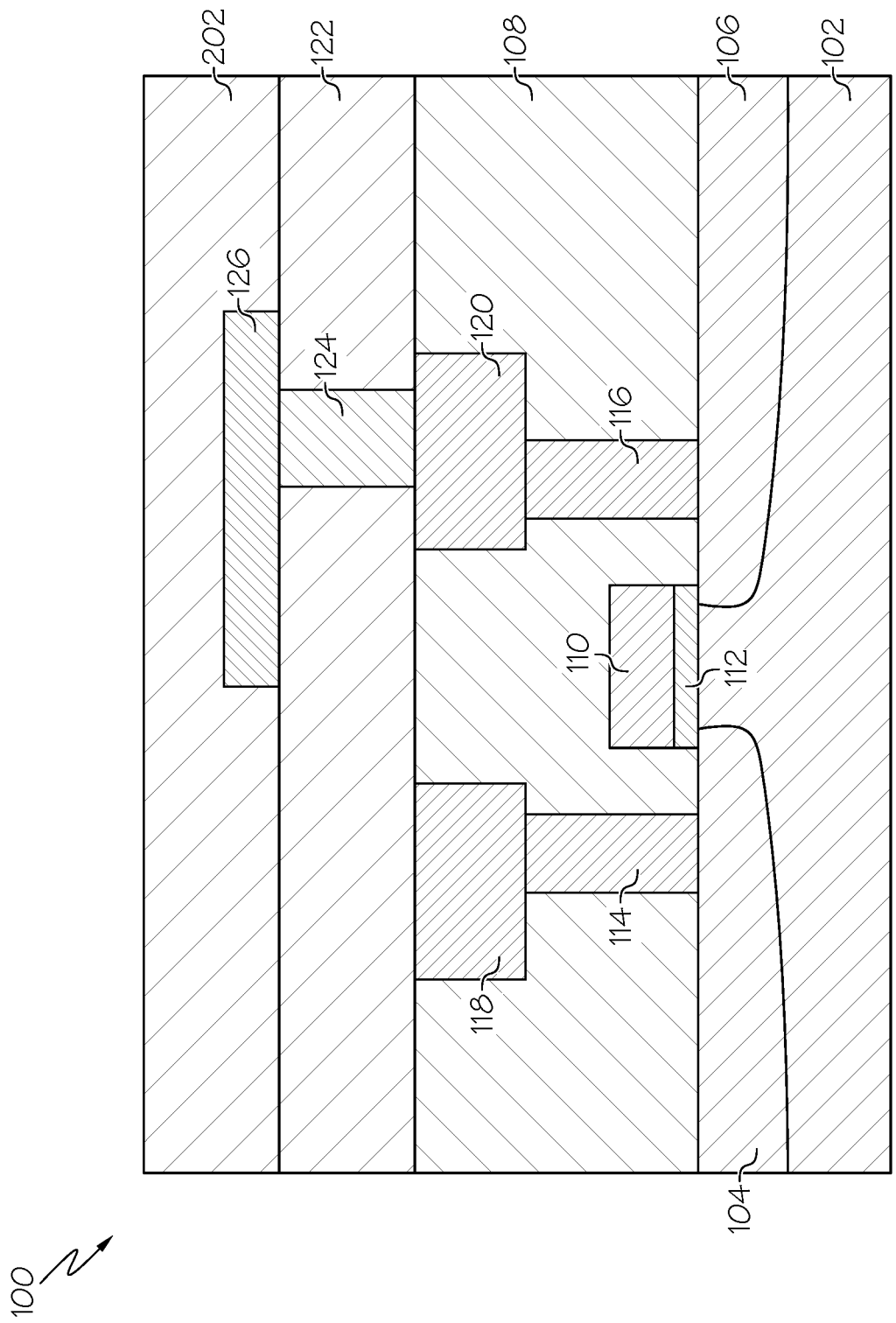
FIG. 2 is a cross-sectional side view of the example semiconductor structure of FIG. 1 at a subsequent point in the example fabrication process.

The a-Si layer 126, with reference to FIG. 2, is then patterned in a circular (or a rectangular or another) shape. A silicon dioxide (SiO₂) layer 202, which may also be referred to as an ILD layer 202 or as a first dielectric layer 202, is deposited on, and contacting a top surface of, the patterned a-Si layer 126, as shown in FIG. 2. The first dielectric layer 202, according to various embodiments, comprises at least one dielectric material selected from the following set of dielectric materials consisting of: Silicon Nitride (SiN), Silicon Carbide (SiC), SiCO, Silicon Oxide, Silicon Dioxide (SiO₂), Carbon Doped Silicon Oxide (SiCOH), one or more silicon-based materials with some or all of the Si replaced by Ge, carbon-doped oxides, inorganic oxides, inorganic polymers, hybrid polymers, organic polymers such as polyamides or SiLK™, other carbon-base materials, organo-inorganic materials such as spin-on glasses and silsesquioxane-based materials, diamond-like carbon (DLC), also known as amorphous hydrogenated carbon, α-C:H), or any of the aforementioned materials in porous form, or in a form that changes during processing to or from being porous and/or permeable to being non-porous and/or non-permeable.

Figure 3:
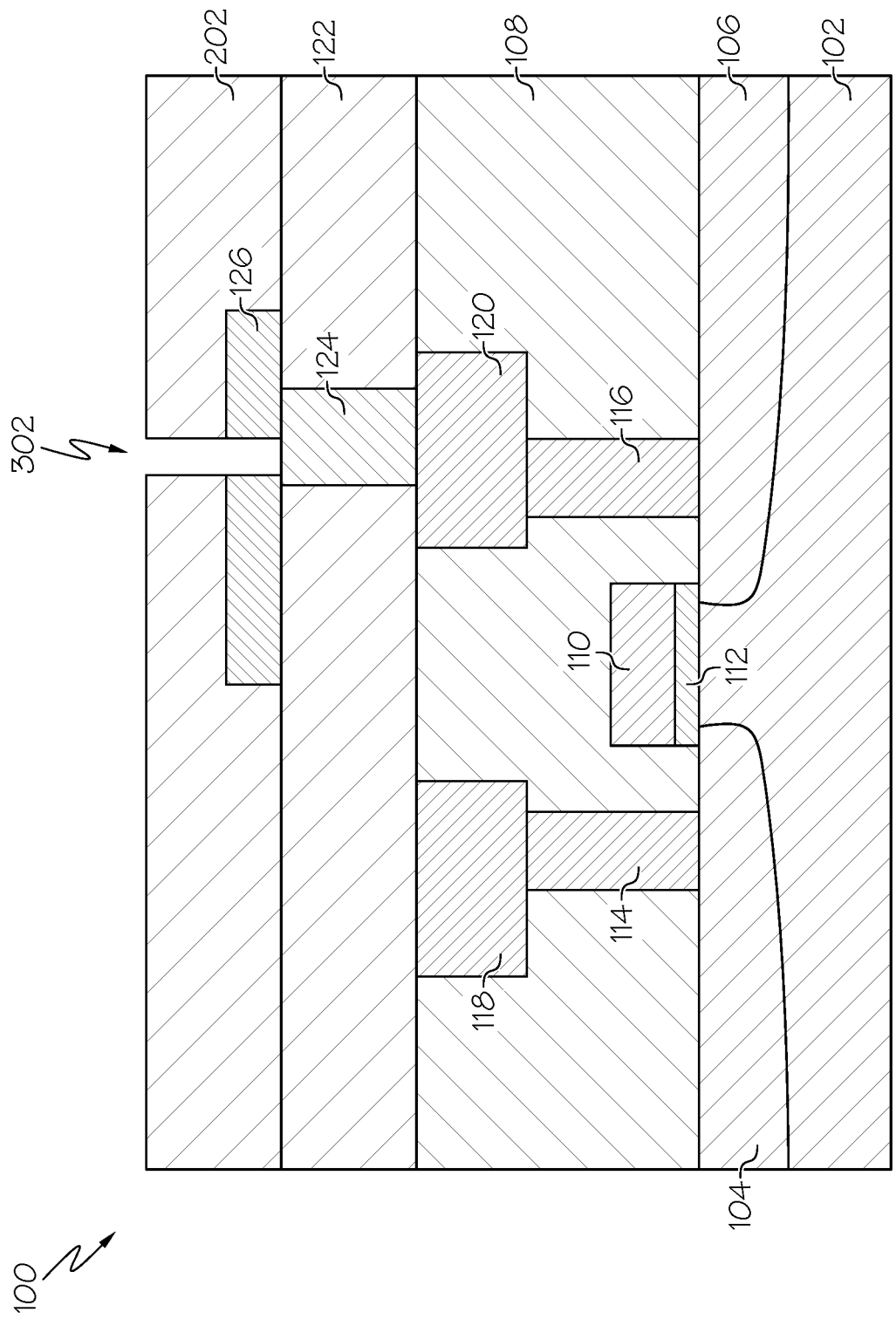
FIG. 3 is a cross-sectional side view of the example semiconductor structure of FIG. 2 at a subsequent point in the example fabrication process, after a vertical cell contact hole is formed.

A vertically-oriented cell contact hole 302, which may be also referred to as a vertical cell contact hole 302, or the like, as shown in FIG. 3, is formed in the SiO₂ layer 202 (also referred to as an ILD layer 202) over, and continuing downward to a bottom surface of the a-Si layer 126, or continuing slightly through the a-Si layer 126. A vertical direction etching process, such as, but not limited to, a dry etch process or a reactive ion etching (RIE) process using a fluoride based chemistry, or another etching process, can be used to form the vertically-oriented cell contact hole 302. According to the example, the vertically-oriented cell contact hole 302 exposes the drain contact 124 in the vertical cell contact hole 302. However, the cell contact hole 302 is located above the drain contact 124, but not necessarily directly above (e.g., vertically aligned with the drain contact 124). The cell contact hole 302 can be located in the a-Si layer 126 at a horizontal location that is close to, but not necessarily directly above, the horizontal location of the drain contact 124.

Figure 4:
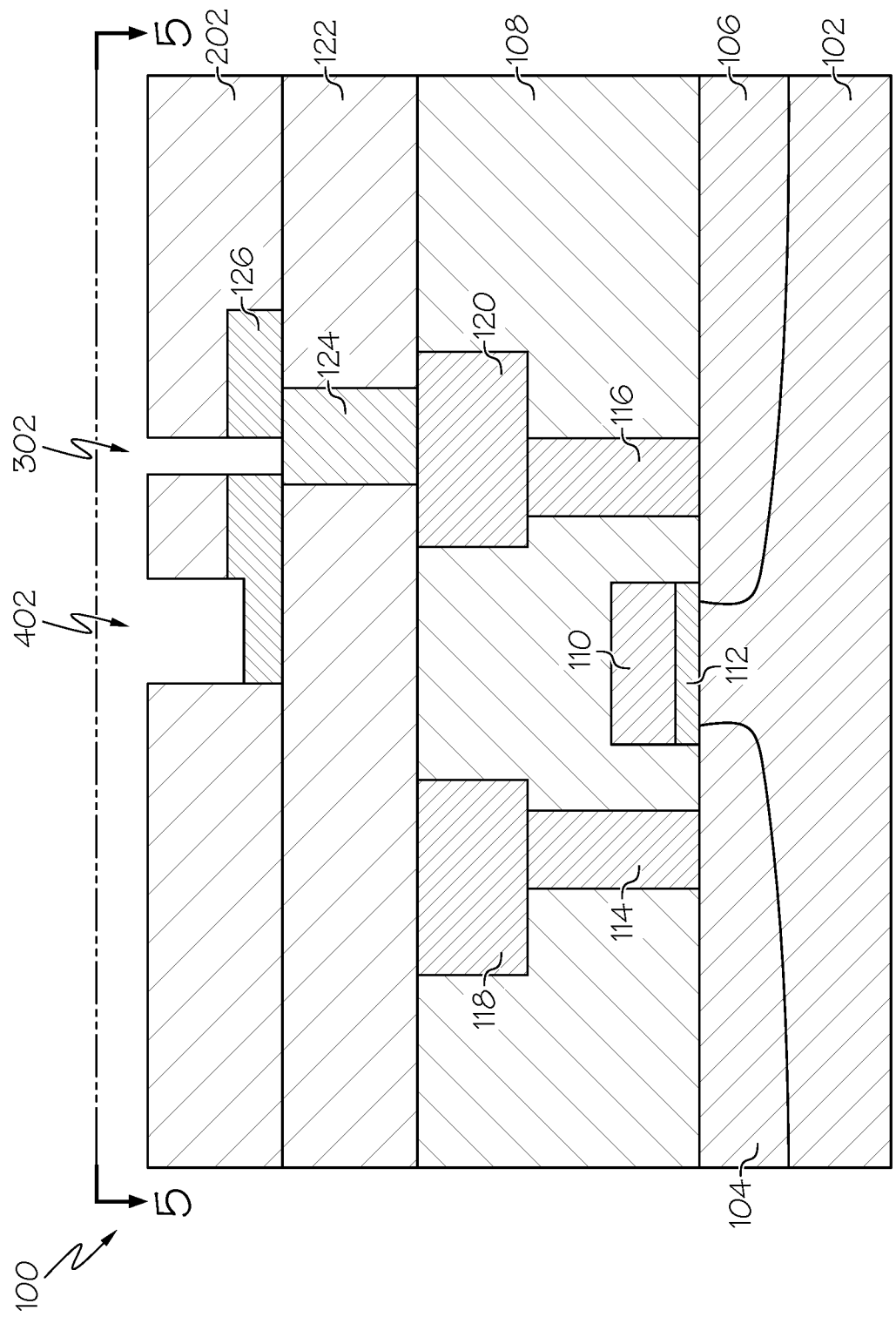
FIG. 4 is a cross-sectional side view of the example semiconductor structure of FIG. 3 at a subsequent point in the example fabrication process, after a vertical access contact hole is formed.

Continuing with the fabrication process, as shown in FIG. 4, a vertically-oriented access contact hole 402, which may be also referred to herein as a vertical access contact hole 402, or the like, is patterned in the SiO₂ layer 202 (which may be also referred to as the ILD layer 202 or the first dielectric layer 202, or the like) directly over, and continuing downward partially into, or through to a bottom surface of, the sacrificial a-Si layer 126. The horizontal critical dimension (CD) of the vertically-oriented access contact hole 402 can be much larger than the horizontal CD of the vertically-oriented cell contact hole 302. The vertically-oriented access contact hole 402 can be formed by a vertical direction etching process, such as, but not limited to, a dry etch process or a reactive ion etching (RIE) process using a fluoride based chemistry, or another etching process.

Figure 6:
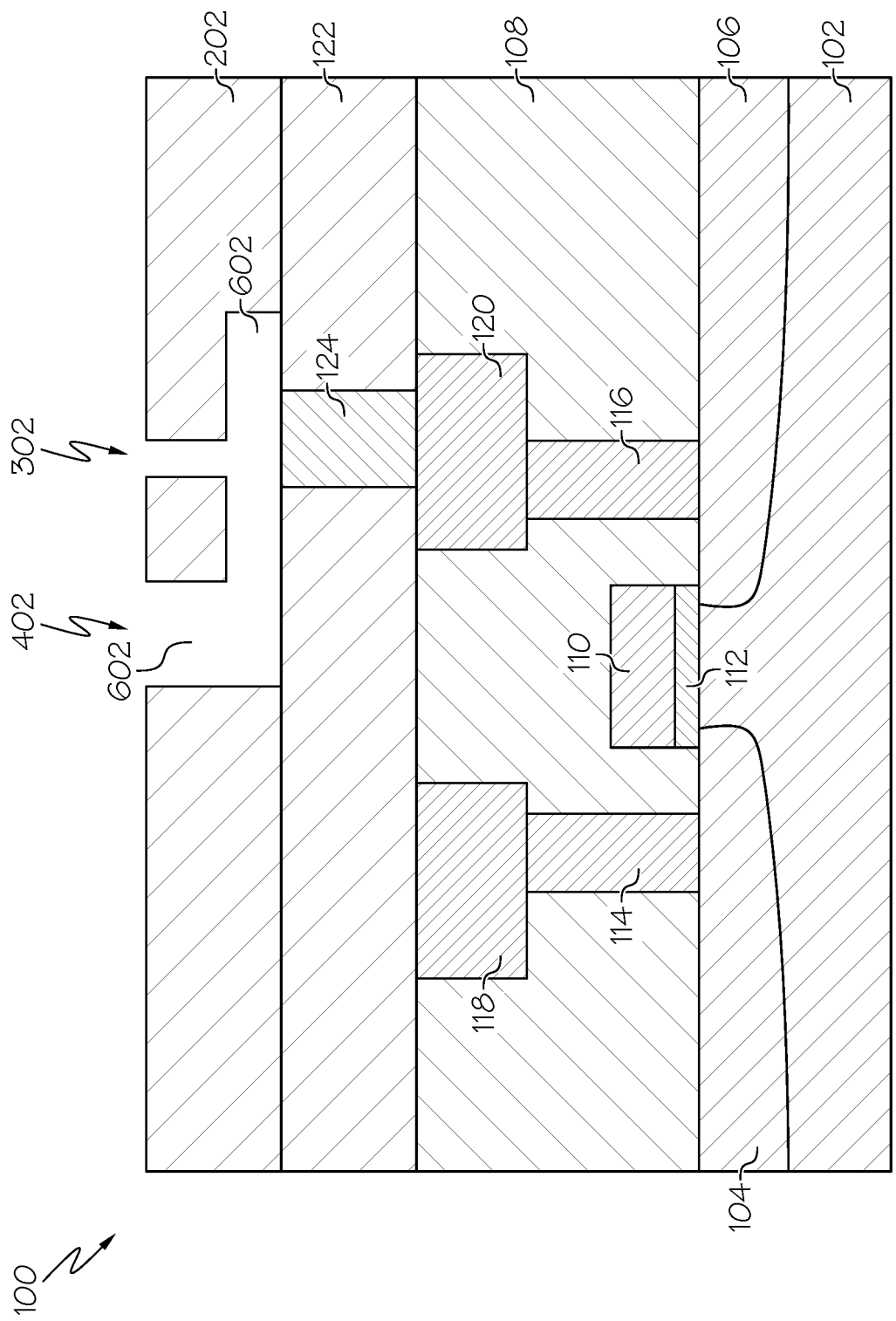
FIG. 6 is a cross-sectional side view of the example semiconductor structure of FIG. 4 at a subsequent point in the example fabrication process, with the a-Si layer removed.

The vertically-oriented access contact hole 402 creates an access opening into the sacrificial a-Si layer 126, where this access opening 402 can have a horizontal CD that is much larger than the horizontal CD of the vertically-oriented cell contact hole 302. This vertically-oriented access contact hole 402, for example, can be used to facilitate an etching process to remove the sacrificial a-Si layer 126 thereby forming a void opening or cavity 602 after the removal of the sacrificial a-Si layer 126 as shown in FIG. 6. The vertically-oriented access contact hole 402 also facilitates access into the void opening or cavity 602 in downstream fabrication process steps. As will be discussed in more detail below, the vertically-oriented access contact hole 402, according to various embodiments, facilitates access into the void opening or cavity 602 to form a bottom electrode 902 of a vertical memory cell 802 (see FIGS. 8, 9, and 10) formed in the vertically-oriented cell contact hole 302.

It should be noted that, while the formation of the vertically-oriented access contact hole 402 and the formation of vertically-oriented cell contact hole 302 are described above separate from each other, the formation of these two holes 302, 402, according to various embodiments, may be performed contemporaneously with each other, or performed separately from each other.

Figure 5:
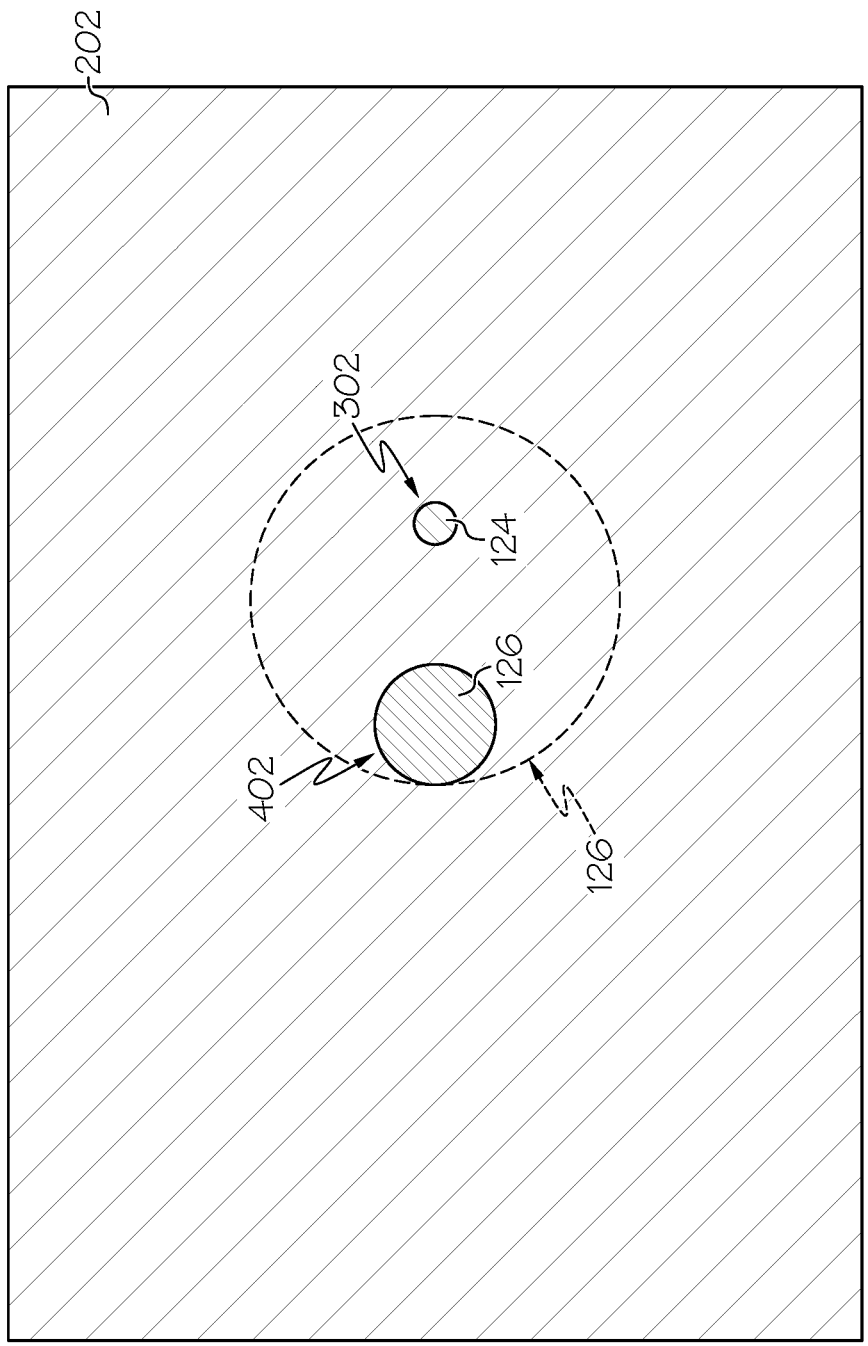
FIG. 5 is a top planar view of the semiconductor structure as shown in FIG. 4.

FIG. 5 illustrates a top planar view of the semiconductor structure 100 at this point in the example semiconductor fabrication process. According to the example, the vertical access contact hole 402 and the vertical cell contact hole 302 are horizontally proximate to each other, both being located directly over the a-Si sacrificial layer 126.

Continuing with the example semiconductor fabrication process, as shown in FIG. 6, the a-Si sacrificial layer 126 is then entirely removed by a selective isotropic etching process. A selective wet etching process, for example, can be by an isotropic etching process. Optionally, the etching could be performed by another suitable wet or dry etch process. The selective etching leaves a void space 602 (which may also be referred to as a cavity 602, or the like) where material from the a-Si sacrificial layer 126 was removed. This cavity 602 connects a bottom opening of the vertically-oriented cell contact hole 302 and a bottom opening of the vertically-oriented access contact hole 402.

Figure 7:
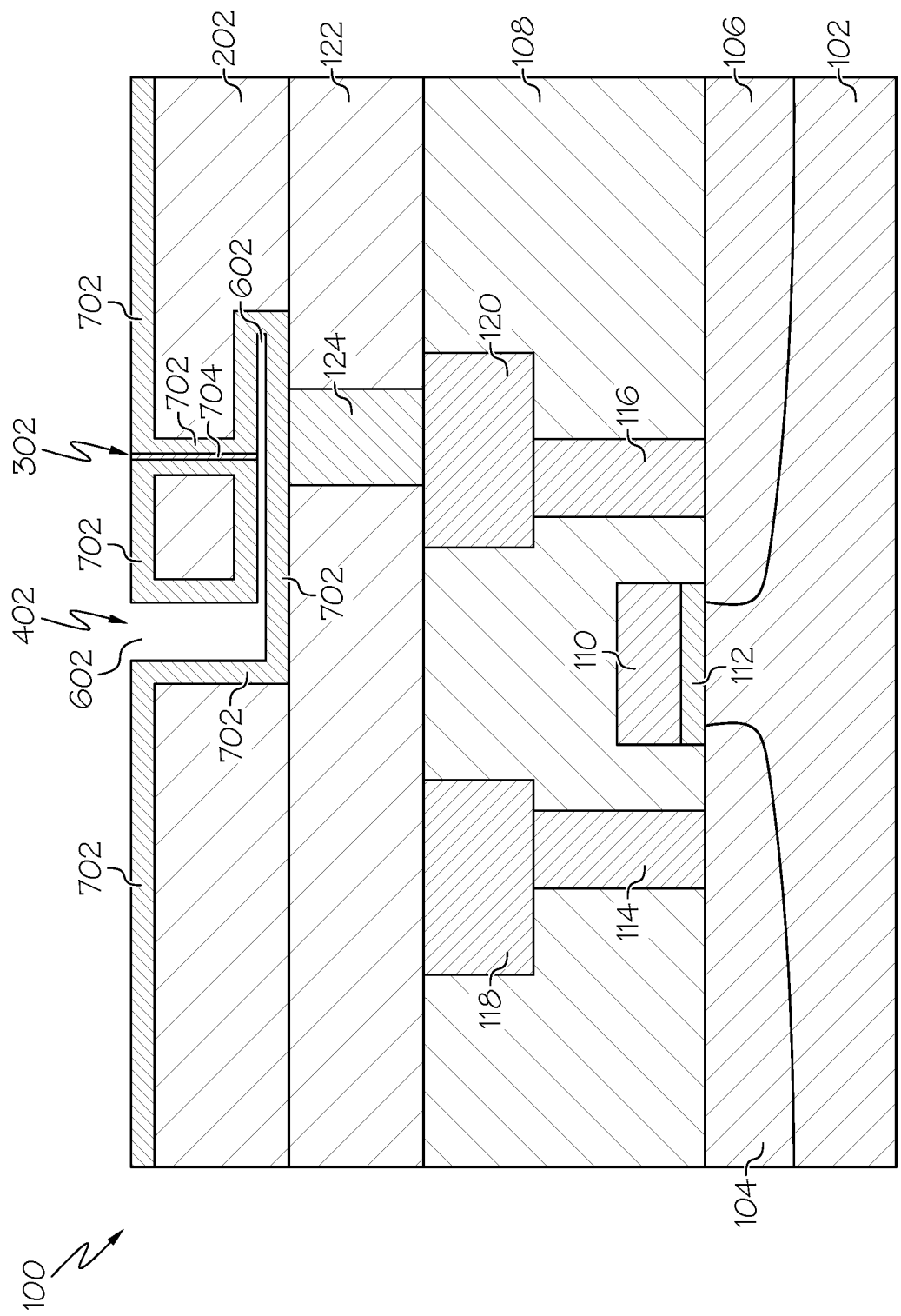
FIG. 7 is a cross-sectional side view of the example semiconductor structure of FIG. 6 at a subsequent point in the example fabrication process, after performing atomic layer deposition of dielectric material filling the vertical cell contact hole and forming a seam.

The example semiconductor fabrication process continues, with reference to FIG. 7, by performing atomic layer deposition (ALD) of dielectric material 702 on exposed surfaces (e.g., the dielectric material 702 is applied and formed on inner sidewalls of the vertical cell contact hole 302) in the semiconductor structure 100. Sequential film layers of the dielectric material 702, as an example each layer being approximately 15 nm thick, are progressively sequentially applied to, and formed on, the exposed surfaces in the semiconductor structure 100. The formed dielectric material 702, according to the example, fills the vertical cell contact hole 302. See also FIG. 8.

Figure 8:
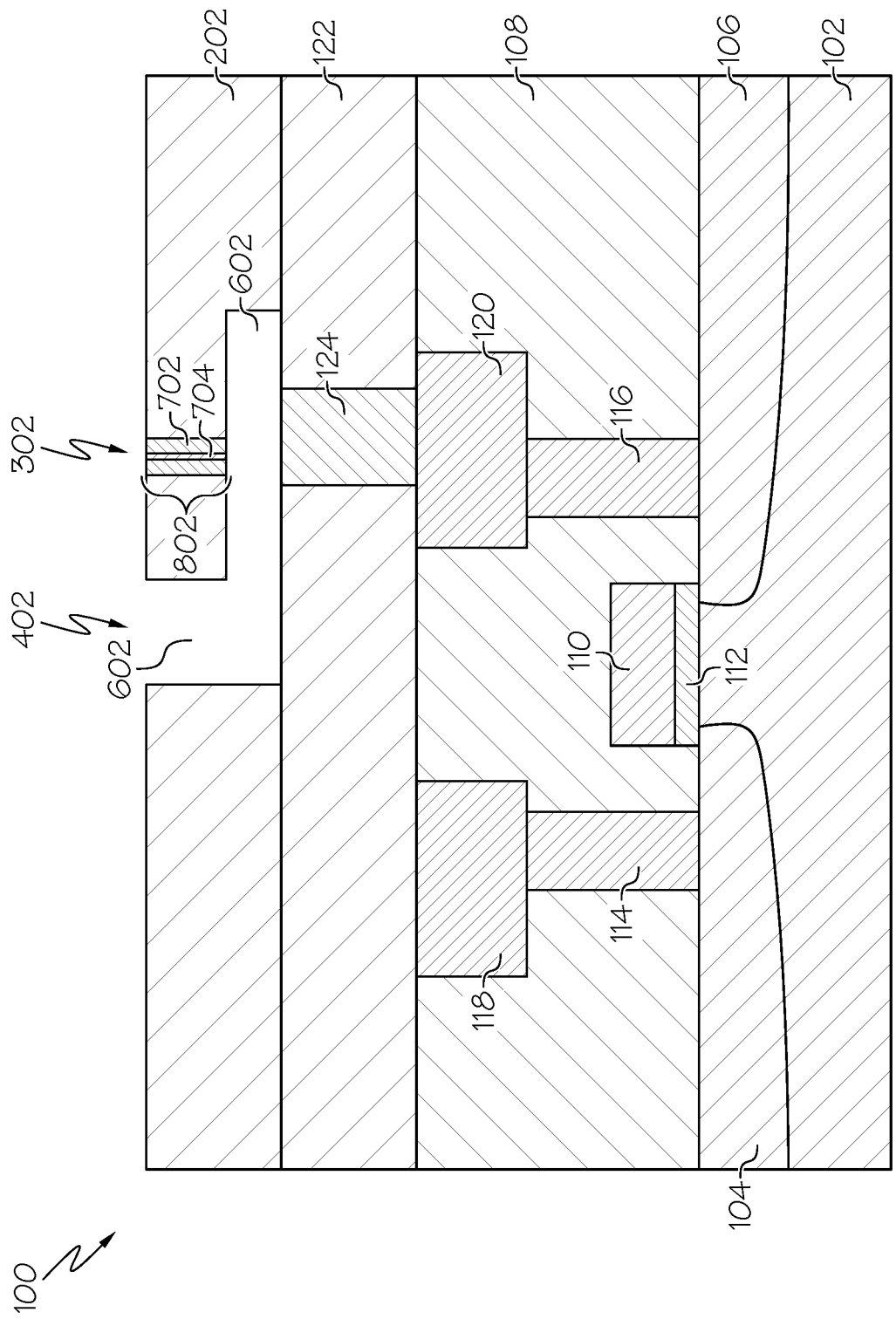
FIG. 8 is a cross-sectional side view of the example semiconductor structure of FIG. 7 at a subsequent point in the example fabrication process.
Figure 10:
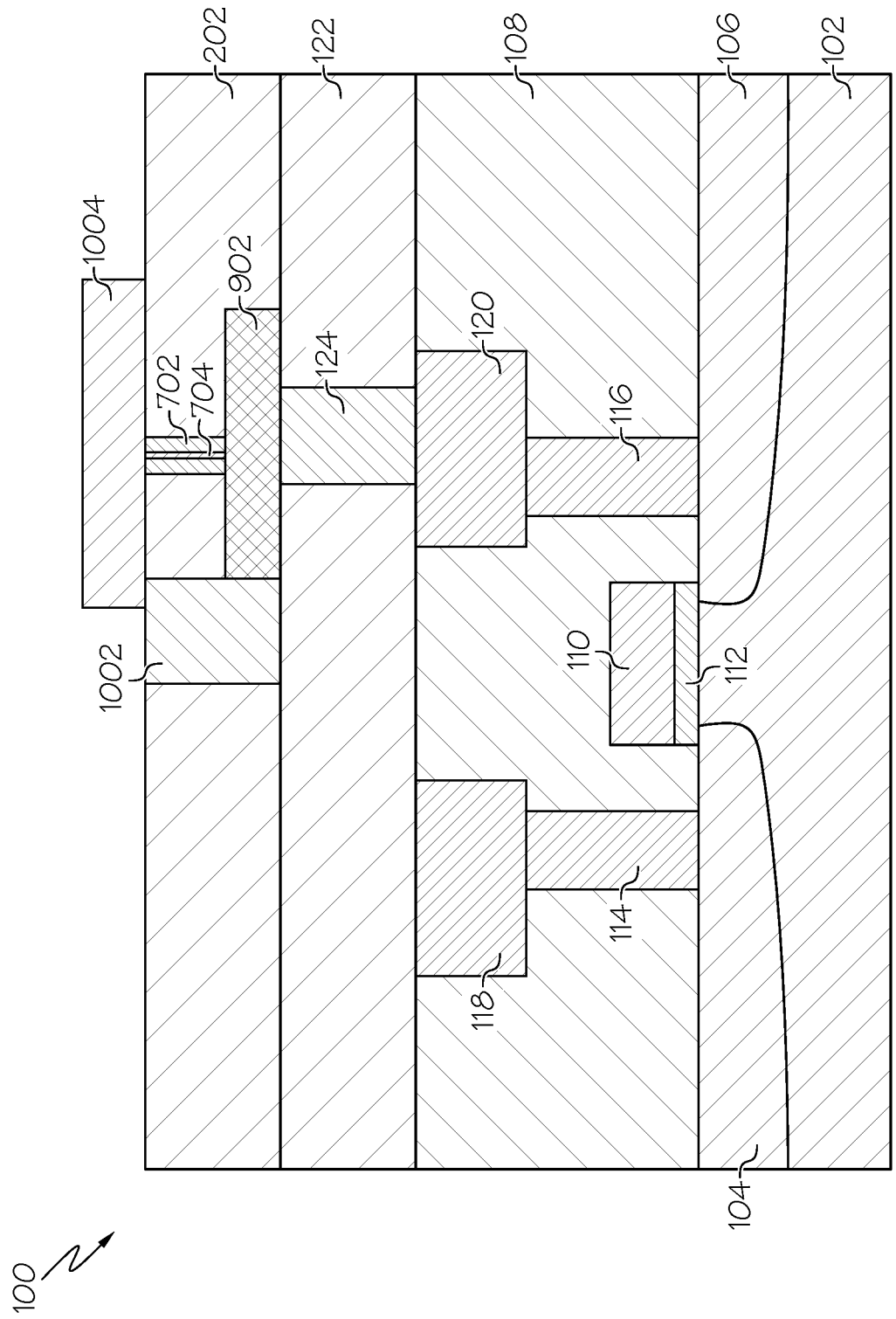
FIG. 10 is a cross-sectional side view of the example semiconductor structure of FIG. 9 at a subsequent point in the example fabrication process, after forming a top electrode of the resistive memory cell.

The dielectric material 702, which in this example fills the vertical cell contact hole 302, includes a vertical seam 704 proximate to a center region (horizontally centered relative to sidewalls of the vertically-oriented cell contact hole 302) of a vertical memory cell 802 (e.g., see FIGS. 8 and 10 showing the fabrication of the vertical memory cell 802, in FIG. 10 including a top electrode 1004 and a bottom electrode 902). The dielectric material 702 (which can also be referred to as a second dielectric layer 702) may include, as an example, a metal with an oxide. As another example, the second dielectric layer 702 may include a metal with a nitride. According to various embodiments, the second dielectric layer 702 comprises at least one dielectric material selected from the following set of dielectric materials consisting of: metal oxide, metal nitride, Silicon Dioxide (SiO2), Silicon Nitride (SiN), Silicon Oxycarbonitride (SiOCN), Carbon-Doped Silicon Nitride (SiCN), or Boron-Doped Silicon Carbonitride (SiBCN), or any combination of the aforementioned dielectric materials.

The dielectric material 702 is applied as a thin film, according to the present example, using an ALD process, to exposed surfaces in the void space 602, to exposed surfaces in the vertical cell contact hole 302 (e.g., on inner sidewalls of the vertical cell contact hole 302), to exposed surfaces in the vertical access contact hole 402 (e.g., on inner sidewalls of the vertical access contact hole 402), and to exposed surfaces on the top surfaces of the semiconductor structure 100, as shown in FIG. 7. The thickness of each film layer of dielectric material 702 being applied by an ALD process, according to the example, can be approximately 15 nm thick. However, other layer thicknesses may be applied according to various embodiments. The layers of thin film of dielectric material 702 are progressively sequentially applied to, and formed on, the exposed surfaces in the semiconductor structure 100. According to the example, after sequential application of the film layers, on top of each other, the thickness of the overall applied thin film of dielectric material 702 will increase until reaching an overall film thickness that is thicker than about half of the diameter of the vertical cell contact hole 302. This film deposition process adds layer on top of layer of the film of the dielectric material 702 until it pinches-off any further application of film layers of dielectric material 702 in the vertical cell contact hole 302. This film deposition process also forms a vertical seam 704 in the dielectric material layer 702 in the vertical cell contact hole 302.

A vertical seam 704 is formed in the second dielectric layer 702 in the vertical cell contact hole 302 as a result of the ALD process, and/or another thin film deposition process, filling the vertical cell contact hole 302 with progressively applied sequential layers of dielectric material 702. The vertical seam 704, according to the example, is formed proximate to a center region (horizontally centered relative to sidewalls of the vertically-oriented cell contact hole 302) of the dielectric material 702 filling the vertical cell contact hole 302. See also the vertical memory cell 802 including the centrally located vertical seam 704 shown in FIG. 8.

An ALD process is used in the present example because it reliably forms a uniform seam in the middle of the vertical cell contact hole 302. While according to the present example an ALD process is used to apply the layers of thin film of dielectric material 702 as discussed above and to form the vertical seam 704, other thin film deposition processes may alternatively, or in addition, be used to apply thin film layers of the dielectric material 702 and/or to form the vertical seam 704. One example deposition process that can be used is a chemical vapor deposition (CVD) process. Another example deposition process that can be used is a physical vapor deposition (PVD) process.

An ALD process that can be used for progressively applying the sequential layers of dielectric material 702 filling the vertical cell contact hole 302 can be, for example, a thermal ALD process. As another example, the ALD process can be a plasma assisted ALD process. The dielectric material layer 702 filling the vertical cell contact hole 302, according to various embodiments, comprises at least one dielectric material selected from the following set of dielectric materials consisting of: metal oxide, metal nitride, Silicon Dioxide ($SiO_2$), Silicon Nitride (SiN), Carbon Doped Silicon Oxide Nitride (SiOCN), Carbon Doped Silicon Nitride (SiCN), Boron and Carbon Doped Silicon Nitride (SiBCN), or any combination of the aforementioned dielectric materials.

The vertical seam 704 is formed by the ALD process proximate to a center region (horizontally centered relative to sidewalls of the vertically-oriented cell contact hole 302) of the dielectric material 702 that according to the example fills the vertical cell contact hole 302. This vertical seam 704, according to various embodiments, can be doped with conductive material to form a single conductive (e.g., resistive) filament at a known location extending vertically inside, from a top electrode 1004 to a bottom electrode 902, of a vertical memory cell 802 (see FIGS. 8 and 10 showing the fabrication of the vertical memory cell 802, in FIG. 10 including a top electrode 1004 and a bottom electrode 902).

This single conductive (resistive) filament arrangement can provide significant advantages to a non-volatile memory, e.g., a resistive random access memory (ReRAM), including a conductive-bridging random access memory (CBRAM). In a non-volatile memory device, according to various embodiments, the memory cell to memory cell operation can be fabricated reliably uniform across the memory cells in the non-volatile memory device. This results in superior overall performance of the non-volatile memory device. The single filament arrangement for each vertical memory cell 802 (see FIGS. 8 and 10) brings certainty of filament formation and of device operation in a non-volatile memory device. The reliability of operation of such a non-volatile memory device, e.g., a ReRAM memory device, is significantly improved. This in turn significantly increases the commercial viability of this type of resistive non-volatile memory device and of the associated semiconductor fabrication process.

Continuing with the example semiconductor fabrication process, as shown in FIG. 8, optionally the excess dielectric material 702 is removed from the void space 602, from the vertical access contact hole 402, and from top surfaces of the semiconductor structure 100, as shown in FIG. 8. An isotropic etch process, dry or wet, or a combination of dry and wet etch processes, can be used to remove the excess dielectric material 702. The dielectric material 702 that filled the vertical cell contact hole 302 will not be removed. A top surface and a bottom surface of the vertical seam 704 proximate to a center region (horizontally centered relative to sidewalls of the vertically-oriented cell contact hole 302) of the vertical memory cell 802, as shown in FIG. 8, will be exposed at a top opening and at a bottom opening of the vertical cell contact hole 302. This vertical seam 704, according to various embodiments, can be doped with conductive material forming a single conductive (e.g., resistive) filament at a known location inside the vertical memory cell 802 (see FIG. 8) in the vertical cell contact hole 302.

Doping of the seam 704 with mobile element (e.g., metallic mobile species), such as copper (Cu) or silver (Ag), can be done to improve switching characteristics of the filament 704 in the vertical memory cell 802. This doping, for example, can inject metallic mobile species into the seam 704 to help form a filament 704. There are various ways to perform doping of the seam 704. Doping, for example, can be done by using a dopant containing electrode 902 or 1004.

Figure 9:
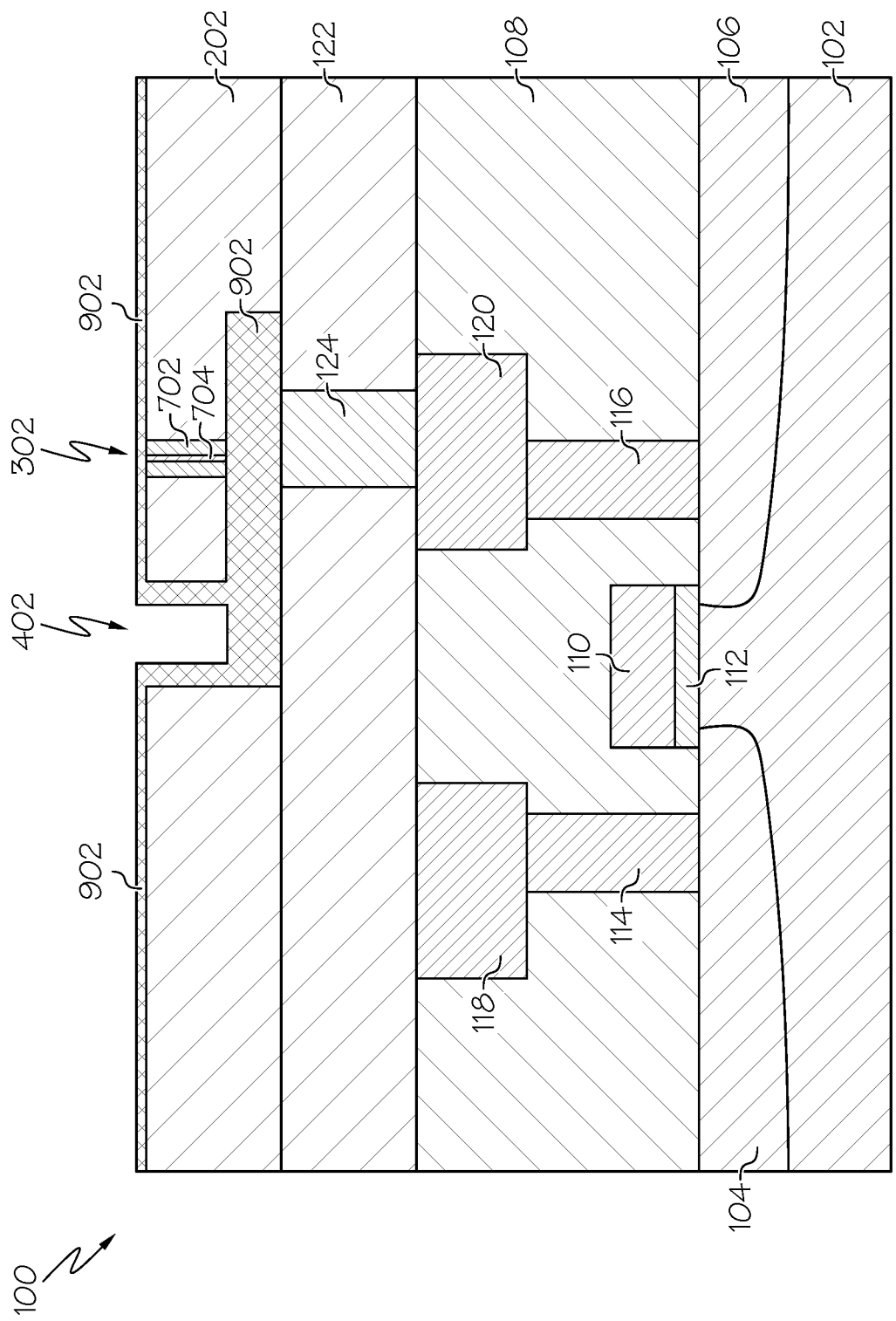
FIG. 9 is a cross-sectional side view of the example semiconductor structure of FIG. 8 at a subsequent point in the example fabrication process, after forming a bottom electrode of a resistive memory cell.

Doping, as another example, can also be done in the example fabrication process after FIG. 9 and before FIG. 10. In reference to FIG. 10, after the dielectric plug material 1002 is formed, dopant material can be deposited and be driven into the seam 704 by thermal annealing. After dopant is driven-in into the seam 704, the dopant on the surface is removed, leaving dopant only in the seam 704.

As will be discussed below with reference to FIG. 10, a top electrode 1004 (see FIG. 10) of the vertical memory cell 802 is formed directly on, and contacting, a top surface of the vertical memory cell 802 and a top surface of the vertical seam (and filament) 704. The top electrode 1004, according to various embodiments, can also be a dopant for doping mobile element (e.g., metallic mobile species) into the vertical seam (and filament) 704. For example, according to certain embodiments, after a metal such as copper (Cu) is deposited on, and contacting, the top surface of the vertical seam (and filament) 704 to form a top electrode 1004 for the vertical memory cell 802, copper atoms can diffuse down and migrate from the top electrode 1004 into the vertical seam (and filament) 704.

As shown in FIG. 9, conductive material 902 can be deposited in the vertically-oriented access contact hole 402 thereby filling the void space 602 under the vertical memory cell 802 (see FIG. 8) and contacting a bottom surface of the vertical memory cell 802 and of the vertical seam 704, thereby forming a bottom electrode 902 for the vertical memory cell 802. The bottom electrode 902 for the vertical memory cell 802 is formed directly on, and contacting a top surface of the target metal contact 124 (e.g., the drain contact 124 of the transistor). The conductive material 902 may partially (or entirely) fill the vertical access contact hole 402, and excess conductive material 902 may be deposited directly on, and contacting, top surfaces of the semiconductor structure 100 as shown in FIG. 9. The deposition of the conductive material 902 can be by a physical vapor deposition (PVD) process or a chemical vapor deposition (CVD) process, or by another conductive material deposition process, or any combination of processes, that allows the conductive material 902 to fill the void space 602 under the vertical memory cell 802 (see FIG. 8) and thereby form the bottom electrode 902 for the vertical memory cell 802.

Continuing with the example semiconductor fabrication process, as shown in FIG. 10, the conductive material 902 is removed from the vertical access contact hole 402, and from the top surfaces of the semiconductor structure 100. As an example, a dry etch process, such as a reactive ion etching (RIE) process using a fluoride based chemistry, can vertically etch the conductive material 902 from the vertical access contact hole 402. The dry etch process, or optionally in combination with a suitable wet etch process, can be used to remove the conductive material 902 from the top surfaces of the semiconductor structure 100. A gap fill of dielectric material in the vertical access contact hole 402 forms a dielectric material plug 1002 that fills the vertical access contact hole 402. The bottom electrode 902 remains in electrical contact with the bottom surface of the vertical memory cell 802, with the bottom surface the vertical seam 704, and with a top surface of the target metal contact 124 (e.g., the drain contact 124 of the transistor).

The example semiconductor fabrication process, as shown in FIG. 10, then performs deposition of conductive material, optionally followed by patterning, that forms a top electrode 1004 over the dielectric layer 702 and over, and in direct contact with, a top surface of the vertical seam 704 (see the vertical memory cell 802 shown in FIG. 8). The top electrode 1004, according to the example fabrication process, contacts a top surface of the vertical seam (and filament) 704 proximate to a center region (horizontally centered relative to sidewalls of the vertically-oriented cell contact hole 302) of the vertical memory cell 802.

The top electrode 1004 (see FIG. 10) of the vertical memory cell 802 formed directly on, and contacting, a top surface of the vertical seam (and filament) 704, can also act as a dopant for adding a mobile element (e.g., metallic mobile species) into the vertical seam (and filament) 704. For example, according to certain embodiments, after conductive material, such as but not limited to copper (Cu) or silver (Ag) or another metal, is deposited on the top surface of the vertical seam (and filament) 704 to form the top electrode 1004, the conductive material atoms (e.g., copper atoms) can diffuse down and migrate from the top electrode 1004 into the vertical seam (and filament) 704 thereby doping the vertical seam (and filament) 704 with conductive material atoms (e.g., with copper atoms).

Separate from using the top electrode 1004 (and/or the bottom electrode 902) as the dopant, a conductive material may be used as a dopant for doping the vertical seam (and filament) 704 according to a doping process. The conductive material may be added as the dopant for doping the vertical seam (and filament) 704 by a separate doping process as part of an overall semiconductor fabrication process as has been discussed above. As an example and not for limitation, conductive material for doping the vertical seam (and filament) 704 may comprise a mobile element (e.g., metallic mobile species), or a non-stoichiometric compound by adding reactive elements, or a combination. A non-stoichiometric compound denotes a compound including quantities of reactants which are not in a simple integral ratio or are not in the ratio expected from an ideal formula or equation. For example, TiO2 is a stoichiometric titanium dioxide. However, TiOx, where x is smaller or larger than 2, is understood to represent a non-stoichiometric titanium oxide.

The vertical seam 704, as another example, may be doped with a conductive material selected from the following set of conductive materials consisting of: metal oxide, non-conductive metal nitride, Copper (Cu), Titanium (Ti), Aluminum (Al), Hafnium (Hf), or Lanthanum (La). The seam 704 accordingly can include material selected from the following set of materials consisting of: metal oxide, non-conductive metal nitride, Copper (Cu), Titanium (Ti), Aluminum (Al), Hafnium (Hf), or Lanthanum (La). The seam 704, as another example, can be doped with at least one of a mobile element or a non-stoichiometric compound by adding reactive elements.

According to various embodiments, the second dielectric layer 702, which was formed by ALD process in the vertically-oriented cell contact hole 302 thereby creating a vertical memory resistive element 802, comprises at least one material selected from the following set of materials consisting of: metal oxide, non-conductive metal nitride, Silicon Oxide, Silicon Dioxide ($SiO_2$), Silicon Nitride (SiN), Silicon Oxy-Nitride, Silicon Oxycarbonitride (SiOCN), Carbon-Doped Silicon Nitride (SiCN), or Silicon-Boron-Carbon Nitride (SiBCN), or any combination of the aforementioned materials. The formed second dielectric layer 702 also can comprise a material selected from the following set of materials consisting of: metal oxide, non-conductive metal nitride, Aluminum (Al), Hafnium (Hf), Zirconium (Zr), Titanium (Ti), Silicon (Si), Germanium (Ge), Copper (Cu), or Lanthanum (La).

At least one of the top electrode 1004 or the bottom electrode 902 (see FIG. 10), according to various embodiments, comprises a conductive material selected from the following set of conductive materials consisting of: Copper (Cu), Cobalt (Co), Aluminum (Al), Tungsten (W), Titanium (Ti), Tantalum (Ta), Ruthenium (Ru), Hafnium (Hf), Zirconium (Zr), Nickel (Ni), Platinum (Pt), Tin (Sn), Silver (Ag), Gold (Au), a conducting metallic compound material, or a conducting metal alloy including at least one of the preceding conductive materials. The vertical seam 704, according to various embodiments, can comprise a single conductive filament 704 extending from the top electrode 1004 to the bottom electrode 902.

Figure 11:
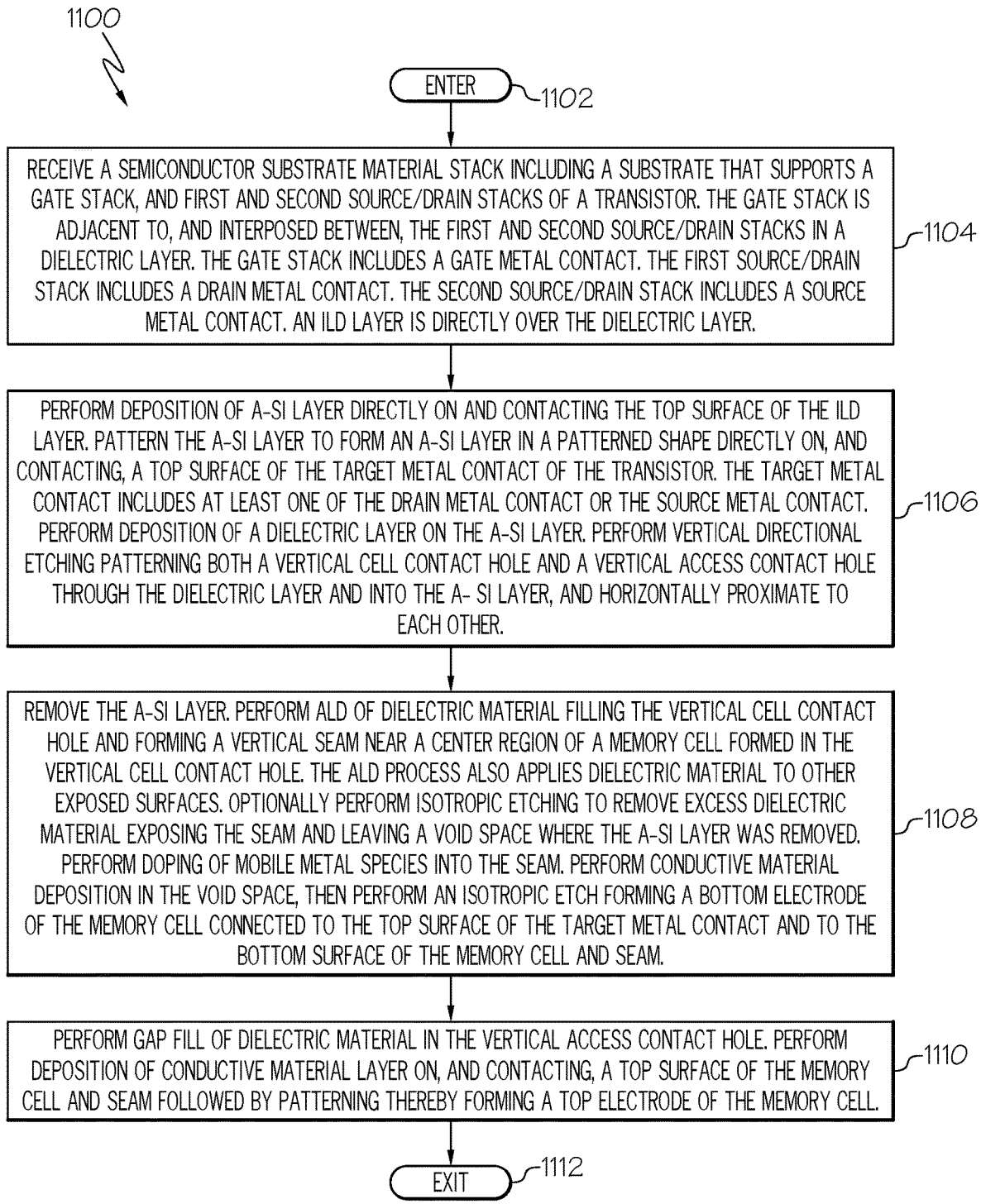
FIG. 11 is an operational flow diagram illustrating an example fabrication process for fabricating a semiconductor structure including a resistive memory cell, according to an embodiment of the present invention.

FIG. 11 illustrates an example method 1100 for fabricating a semiconductor structure comprising a vertical memory cell electrically connected to a transistor device on a substrate. Various embodiments of the invention may include some, and not necessarily all, of the method steps in the illustrated example.

The example fabrication method enters, at step 1102, and immediately proceeds, at step 1104, to receive a semiconductor substrate material stack including a substrate 102 that supports a gate stack, and first and second source/drain stacks of a transistor. The gate stack is adjacent to, and interposed between, the first and second source/drain stacks in a dielectric layer 108. The gate stack includes a gate metal contact 110. The first source/drain stack includes a drain metal contact 116, 120. The second source/drain stack includes a source metal contact 114, 118. An ILD layer 122 is directly over the dielectric layer 108. A target metal contact 124 is in the ILD layer 122.

The semiconductor fabrication method continues, as step 1106, by performing deposition of a-Si layer 126 directly on and contacting the top surface of the ILD layer 122. Pattern the a-Si layer to form an a-Si layer 126 in a patterned shape directly on, and contacting, a top surface of the target metal contact 124 of the transistor. According to the example, the target metal contact 124 includes, and is electrically coupled with, at least one of the drain metal contact 116, 120, or the source metal contact 114, 118. Perform deposition of a first dielectric layer 202 on the a-Si layer 126. Perform vertical directional etching patterning both a vertical cell contact hole 302 and a vertical access contact hole 402 through the first dielectric layer 202 and into the a-Si layer 126. The vertical cell contact hole 302 and the vertical access contact hole 402, according to the example, are horizontally proximate to each other directly over the a-Si layer 126.

The semiconductor fabrication method continues, as step 1108, by removing the a-Si layer 126. Then, ALD of dielectric material 702 is performed thereby filling the vertical cell contact hole 302 and forming a vertical seam 704 near a center region of a memory cell 802 formed in the vertical cell contact hole 302. The ALD process also applies dielectric material 702 to other exposed surfaces in the dielectric structure 100. The semiconductor fabrication method then continues by performing isotropic etching to remove excess dielectric material 702 from the semiconductor structure 100 thereby exposing the seam 704 and leaving a void space 602 where the a-Si layer 126 was removed. The semiconductor fabrication method performs doping of mobile metal species into the seam 704. Then, conductive material 902 is deposited in the void space 602, followed by an isotropic etch, thereby forming a bottom electrode 902 of the memory cell 802. The bottom electrode 902 is electrically connected to the top surface of the target metal contact 124 and to the bottom surface of the memory cell 802 and the bottom surface of the seam 704.

The semiconductor fabrication method continues, as step 1110, by performing a dielectric material gap fill deposition in the vertical access contact hole 402 thereby creating a dielectric plug 1002. The method then performs deposition of a conductive material layer 1004 on, and contacting, a top surface of the memory cell 802 and a top surface of the seam 704, followed by patterning, thereby forming a top electrode 1004 of the memory cell 802.

The fabrication method is then exited, at step 1112.

The design of a resistive non-volatile memory device, e.g., a ReRAM memory device, according to various embodiments, includes a plurality of vertical memory cells 802 where each memory cell 802 includes a single vertical conductive seam 704. This can significantly improve reliability of operation of the non-volatile memory device. The memory cell to memory cell operation can be fabricated reliably uniform across the memory cells in the non-volatile memory device, which results in superior overall performance of the non-volatile memory device. The single filament arrangement for each vertical memory cell 802 brings certainty of filament formation and of device operation in the non-volatile memory device. According to various embodiments, this can also reduce fabrication process defects and can lower semiconductor product manufacturing costs. This in turn significantly increases the commercial viability of this type of resistive non-volatile memory device and of the associated semiconductor fabrication process.

Although specific embodiments of the invention have been disclosed, those having ordinary skill in the art will understand that changes can be made to the specific embodiments without departing from the scope of the invention. The scope of the invention is not to be restricted, therefore, to the specific embodiments, and it is intended that the appended claims cover any and all such applications, modifications, and embodiments within the scope of the present invention.

It should be noted that some features of the present invention might be used in one embodiment thereof without use of other features of the present invention. As such, the foregoing description should be considered as merely illustrative of the principles, teachings, examples, and exemplary embodiments of the present invention, and not a limitation thereof.

In addition, these embodiments are only examples of the many advantageous uses of the innovative teachings herein. In general, statements made in the specification of the present application do not necessarily limit any of the various claimed inventions. Moreover, some statements may apply to some inventive features but not to others.

What is claimed is:

1. A method of fabricating a semiconductor structure including at least one resistive memory cell, the method comprising:
   forming a dielectric layer on inner sidewalls of a cell contact hole above a cavity in a semiconductor structure, wherein a seam is formed in the dielectric layer between the inner sidewalls of the cell contact hole;
   forming a bottom electrode within a portion of the cavity, the bottom electrode in contact with a top surface of a target electrical contact and with a bottom surface of the dielectric layer and a bottom surface of the seam; and
   forming a top electrode over the dielectric layer and in direct contact with a top surface of the dielectric layer and a top surface of the seam.

2. The method of claim 1, further comprising:
   forming a sacrificial layer on, and in contact with, the target electrical contact;
   forming a second dielectric layer over, and in contact with, the sacrificial layer;
   forming the cell contact hole through the second dielectric layer and exposing a first portion of the sacrificial layer;
   forming an access contact hole through the second dielectric layer and exposing a second portion of the sacrificial layer; and
   removing remaining portions of the sacrificial layer thereby forming the cavity directly connecting a bottom opening of the cell contact hole and a bottom opening of the access contact hole.

3. The method of claim 1, wherein the dielectric layer is formed by atomic layer deposition of dielectric material on the inner sidewalls of the cell contact hole above the cavity, and wherein the seam in the dielectric layer is formed by the atomic layer deposition of the dielectric material.

4. The method of claim 1, wherein the seam is formed vertically oriented and located proximate to a center region of the dielectric layer between the inner sidewalls of the cell contact hole above the cavity.

5. The method of claim 1, wherein the dielectric layer comprises at least one material selected from the following set of materials consisting of:
   metal oxide, non-conductive metal nitride, Silicon Oxide, Silicon Dioxide ($SiO_2$), Silicon Nitride (SiN), Silicon Oxy-Nitride, Silicon Oxycarbonitride (SiOCN), Carbon-Doped Silicon Nitride (SiCN), or Silicon-Boron-Carbon Nitride (SiBCN), or any combination of aforementioned materials.

6. The method of claim 1, wherein the dielectric layer comprises at least one material selected from a set of materials consisting of:
   metal oxide, non-conductive metal nitride, Aluminum (Al), Hafnium (Hf), Zirconium (Zr), Titanium (Ti), Silicon (Si), Germanium (Ge), Copper (Cu), or Lanthanum (La).

7. The method of claim 1, further comprising:
   doping the seam with at least one of a mobile element or a non-stoichiometric compound by adding reactive elements.

8. The method of claim 1, further comprising:
   doping the seam with a conductive material selected from a set of conductive materials consisting of: Copper (Cu), Titanium (Ti), Aluminum (Al), Hafnium (Hf), or Lanthanum (La).

9. The method of claim 1, wherein the seam comprises a conductive filament extending from the top electrode to the bottom electrode.

10. The method of claim 1, wherein the top electrode, the dielectric layer, the seam comprising a conductive filament, the bottom electrode, and the target electrical contact, collectively form a resistive memory cell in a semiconductor structure fabricated according to the method.

11. The method of claim 1, wherein at least one of the top electrode or the bottom electrode, comprises a conductive material selected from a set of conductive materials consisting of: Copper (Cu), Cobalt (Co), Aluminum (Al), Tungsten (W), Titanium (Ti), Tantalum (Ta), Ruthenium (Ru), Hafnium (Hf), Zirconium (Zr), Nickel (Ni), Platinum (Pt), Tin (Sn), Silver (Ag), Gold (Au), a conducting metallic compound material, or a conducting metal alloy including at least one preceding conductive material.

12. A method of fabricating a semiconductor structure including at least one resistive memory cell, the method comprising:
   providing a semiconductor material stack including:
      a substrate;
      a gate stack including a gate metal contact;
      a first source-drain stack including a first source/drain metal contact; and
      a second source-drain stack including a second source/drain metal contact, the substrate supporting the gate stack and the first and second source-drain stacks;
   performing deposition of an amorphous silicon (a-Si) layer directly on, and contacting, a top surface of a target metal contact, the target metal contact being electrically connected to at least one of
      the first source/drain metal contact, or
      the second source/drain metal contact;
   performing deposition of an inter-layer dielectric (ILD) layer directly on, and contacting, a top surface of the a-Si layer;
   performing vertical directional etching in the ILD layer from a top surface thereof downward to at least a bottom surface thereof forming a vertical cell contact hole in the ILD layer exposing the a-Si layer in the vertical cell contact hole;
   performing vertical directional etching in the ILD layer from a top surface thereof downward to at least a bottom surface thereof forming a vertical access contact hole in the ILD layer and exposing the a-Si layer in the vertical access contact hole, the vertical access contact hole being located horizontally proximate to the vertical cell contact hole;
   performing isotropic etching removing the a-Si layer leaving a void space therefor;
   performing atomic layer deposition of dielectric material filling the vertical cell contact hole in the ILD layer and forming a vertical seam near a center of a vertical memory cell formed in the vertical cell contact hole;
   performing deposition of conductive material in the vertical access contact hole filling the vertical access contact hole and the void space forming a bottom electrode of the vertical memory cell directly on, and contacting, a top surface of the target metal contact, and contacting a bottom surface of the vertical memory cell and the vertical seam; and
   performing deposition of conductive material on, and contacting, a top surface of the vertical memory cell and the vertical seam, forming a top electrode of the vertical memory cell.

13. The method of claim 12, further comprising:
   doping the vertical seam with a conductive material selected from a set of conductive materials consisting of: Copper (Cu), Titanium (Ti), Aluminum (Al), Hafnium (Hf), or Lanthanum (La).

* * * * *